United States Patent [19]
Dunn

[11] Patent Number: 6,050,739
[45] Date of Patent: Apr. 18, 2000

[54] ROBOT END EFFECTOR FOR AUTOMATED WET WAFER PROCESSING

[75] Inventor: L. Brian Dunn, Boise, Id.

[73] Assignee: Micron Technology, Inc., Boise, Id.

[21] Appl. No.: 08/980,702

[22] Filed: Dec. 1, 1997

[51] Int. Cl.⁷ .................................................... B25G 3/00
[52] U.S. Cl. .......................... 403/260; 403/230; 414/941; 74/490.01
[58] Field of Search .................................... 403/260, 258, 403/256, 230, 231, 401; 414/941; 901/28, 29; 74/490.01; 29/464, 466

[56] References Cited

U.S. PATENT DOCUMENTS

| | | | |
|---|---|---|---|
| 3,656,393 | 4/1972 | Goellner | 29/464 X |
| 4,461,195 | 7/1984 | Barnick | 403/260 X |
| 4,518,349 | 5/1985 | Tressler et al. | 414/941 X |
| 4,604,027 | 8/1986 | Becker et al. | 414/941 X |
| 5,295,777 | 3/1994 | Hodos | 414/941 X |
| 5,440,971 | 8/1995 | Yuda | 403/258 X |
| 5,570,994 | 11/1996 | Somekh et al. | 414/941 X |
| 5,613,793 | 3/1997 | Dennis et al. | 403/256 |
| 5,679,160 | 10/1997 | Wallace et al. | 118/669 |
| 5,759,268 | 6/1998 | Begin et al. | 414/941 |

Primary Examiner—Lynne H. Browne
Assistant Examiner—David E. Bochna
Attorney, Agent, or Firm—Trop, Pruner, Hu & Miles, P.C.

[57] ABSTRACT

A robot end effector for automated processing facilitates wet wafer processing by improving the maintenance of the end effector. In particular, the end effector may be exposed to a variety of chemical conditions in the course of its operation. By making the end effector finger removable from the arm, maintenance of the end effector finger is facilitated. By providing alignment means between the end effector finger and the arm, one can insure that the finger is accurately positioned on the arm after such maintenance.

8 Claims, 3 Drawing Sheets

ROBOT END EFFECTOR FOR AUTOMATED WET WAFER PROCESSING

This invention relates generally to robots used in semiconductor processing and particularly to robots used for wet wafer processing.

BACKGROUND OF THE INVENTION

Semiconductor wafers may be processed in a variety of wet steps to effect cleaning, etching, stripping, coating and other results. Often the chemicals may be caustic or corrosive.

Robots may be utilized to transfer the wafers between various stations and to physically process those wafers at a particular station. The robots, under computer control, allow the wafer fabrication process to be accurately controlled by computer and it is possible to know at every stage where a given wafer is in the process. In addition, the robot can handle heavy wafer batches.

In conventional robotic wet wafer processing operations, the robot includes an arm or end effector which is adapted with fingers. The end effector adapts the robot to semiconductor processing. In particular, the disc-shaped silicon wafers are somewhat delicate to handle and must be treated with care to avoid damaging the wafers. To this end, the wafers are conventionally carried in a carrier with a handle. A number of wafers may be held on edge in the carrier so that all of the wafers in the carrier will receive, at least so long as they are in the same carrier, the same wafer processing.

With robots specially adapted to engage the wafer carriers, the wafer fabrication process can be automated, achieving many of the advantages described above. However, it is necessary that the robot arm carrying the carrier also be exposed to many of the chemical conditions that the wafers themselves are exposed to in the normal course of operation of the robot. The end effectors may be covered by a material that can withstand high temperature, corrosive conditions. If that covering material is scratched, the underlying metal may be subject to corrosive attack. This may require repair of the end effector. This repair may involve re-machining and re-coating.

The arms must be precisely attached to the robot. This is because the robot is programmed to move the arm through desired patterns, assuming the arm is oriented as it was when the arm motion was programmed. Since the orientation of the arm on the robot is adjustable, repositioning the arm after maintenance can be a painstaking process.

Therefore, there is a need for a system which facilitates the maintenance of the end effectors used for the wet wafer processing.

SUMMARY OF THE INVENTION

A robot end effector for automated processing facilitates wet wafer processing by improving the maintenance of the end effector. In particular, the end effector may be exposed to a variety of chemical conditions in the course of its operation. By making the end effector finger removable from the arm, maintenance of the end effector finger is facilitated. By providing alignment means between the end effector finger and the arm, one can insure that the finger is accurately positioned on the arm after such maintenance.

Among the advantages achievable by one or more aspects of the present invention are improved maintainability, faster maintenance and greater reliability.

In accordance with one aspect of the present invention, a wet wafer processing robot includes an arm having an end effector finger adapted to engage a wafer carrier. The finger is removable from the arm.

In accordance with another aspect of the present invention, a robot end effector useful for wet wafer processing includes an end effector finger adapted to engage a wafer carrier. The finger is removably secured to the end effector.

In accordance with yet another aspect of the present invention, a method of maintaining a robot used for wet wafer processing includes the step of removing the wafer carrier engaging finger from the remainder of the robot arm. The finger must be cleaned and aligned precisely with the robot arm and secured to the robot arm.

DESCRIPTION OF THE PREFERRED EMBODIMENTS

Figure 1:
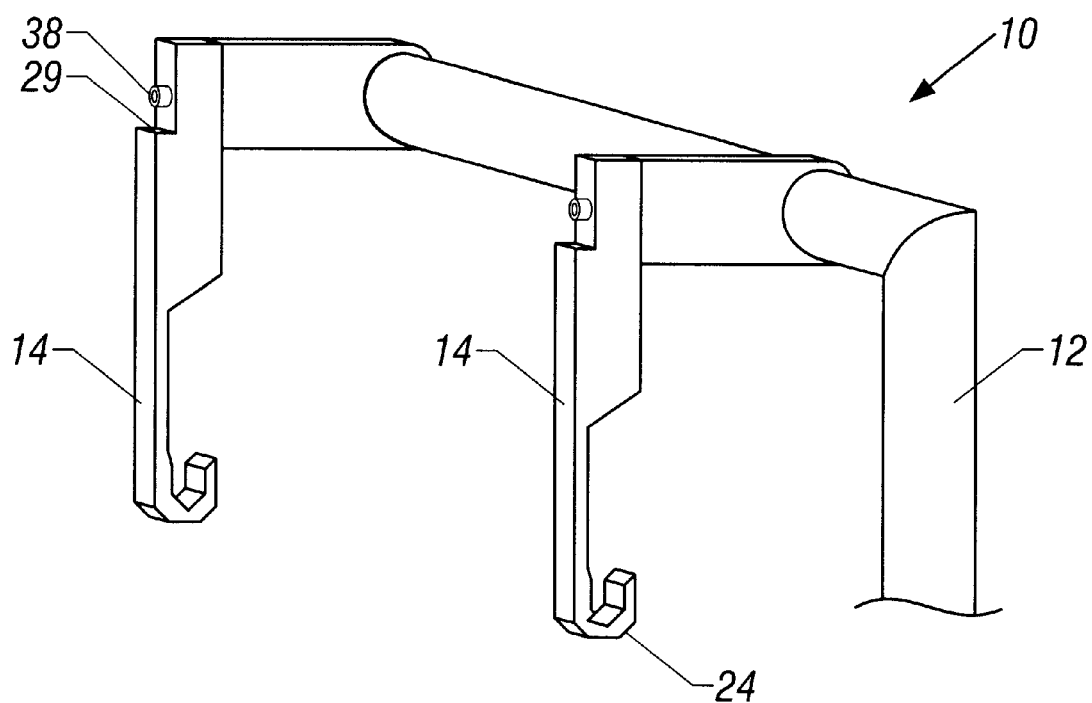
FIG. 1 is a partial perspective view of a robot end effector.

Referring to the drawing wherein like reference characters are used for like parts throughout the several views, a wet wafer processing robot 10 may be utilized to automate the wet processing of semiconductor wafers and to facilitate the transfer of the wafers from station to station in a semiconductor process. A variety of robots are specially adapted to this operation, including the robots distributed by STEAG MicroTech, Inc., Austin, Tex.

Figure 2:
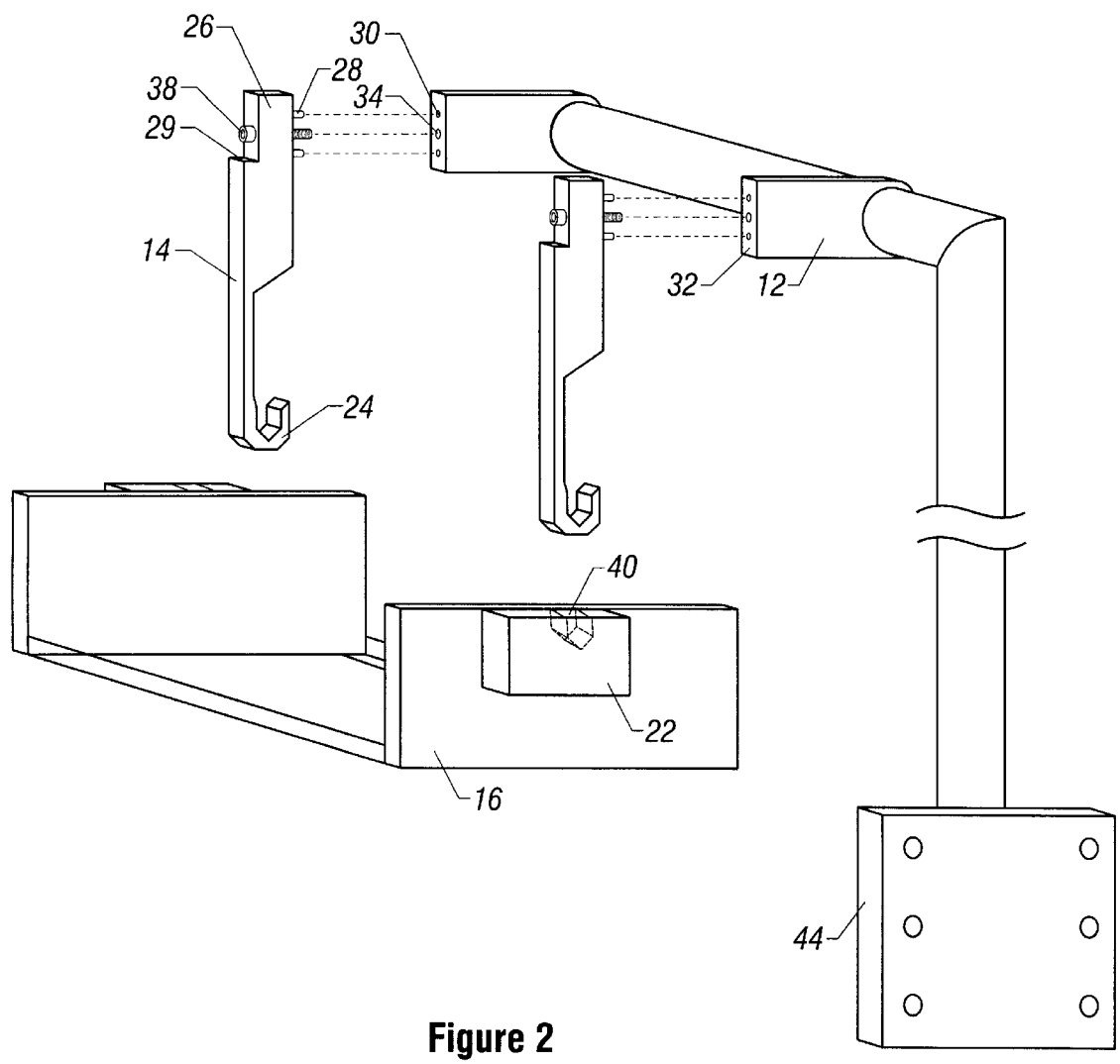
FIG. 2 is an exploded, partial perspective view of a robot end effector and wafer carrier.
Figure 3:
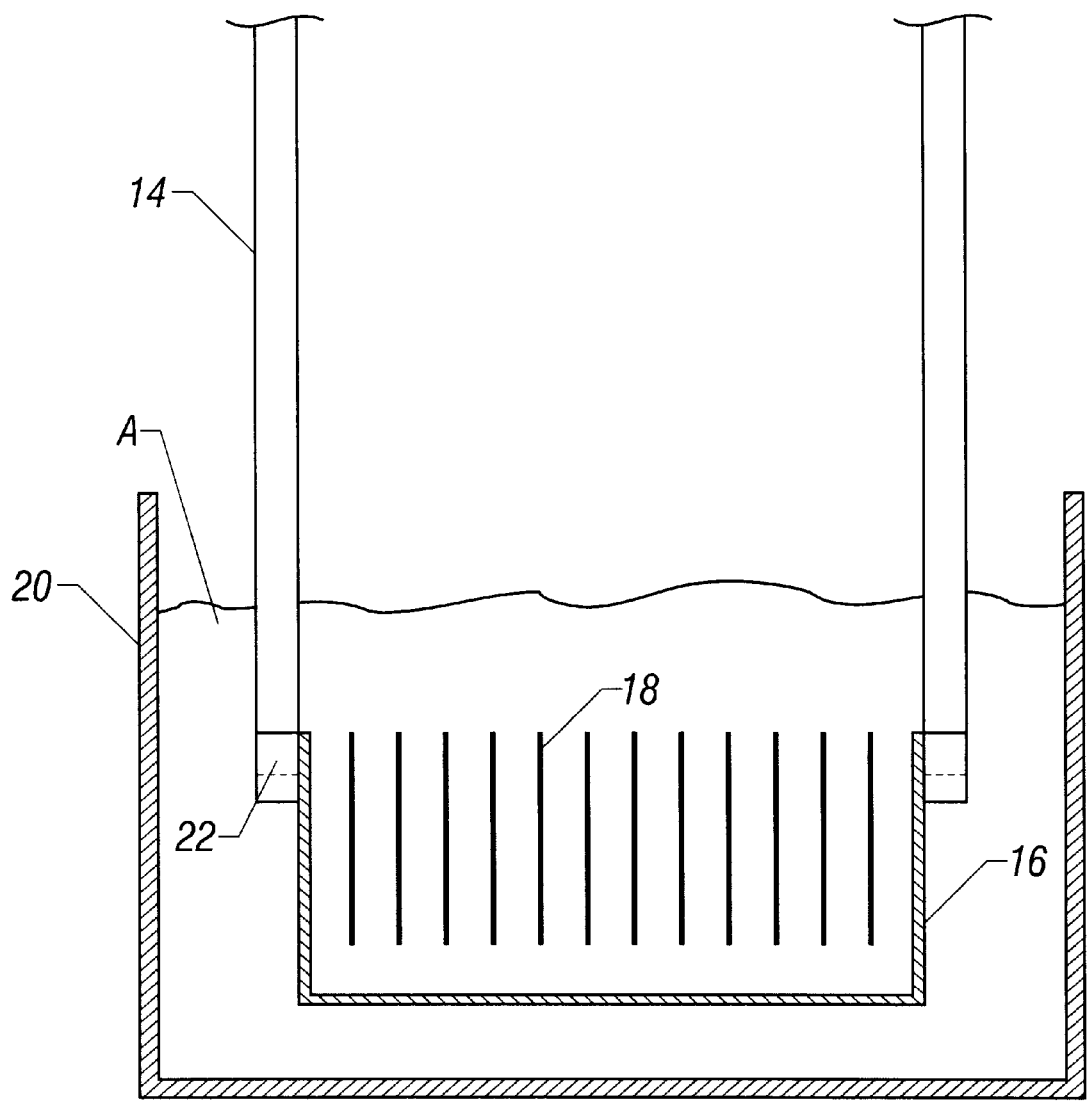
FIG. 3 is a cross-sectional view of a robot end effector in the course of wet wafer processing.

As illustrated in FIG. 1, the wet wafer processing robot connects via bolts (not shown) and the plate 44 to an end effector 12 which is connected to end effector fingers 14. End effector fingers 14 are designed to engage a wafer carrier 16, as shown in FIG. 2. The carrier 16, holds a plurality of semiconductor wafers 18 on edge inside the carrier, as shown in FIG. 3. Because the carrier 16 is open, chemicals "A" inside the tank 20 are available to treat the wafers.

The carrier 16 includes a handle frame 22 of a distinct shape. End effector fingers 14 include a hook-shaped portion 24 which is designed to engage the catch 40 of the carrier 16. The portion 24 enters the opening 42 in the frame 22, translates and is raised to engage the catch 40. In the natural course of wet wafer processing, the end effector fingers 14 are exposed to severe chemical environments used for wafer etching, cleaning or the like. To improve the maintainability of the end effector 14, the end effector fingers 14 are adapted to removably connect to the remainder of the robot end effector 12.

As shown in FIG. 2, the shank 26 of the end effector 12 includes a notch 29. A pair of pins 28 extend transversely to the length of the effector finger 14 to engage slots 30 on the face 32 of the arm 12. The pins 28 guide the effector finger 14 into alignment with the remainder of the end effector 12. At the same time a socket head cap screw 38 extends through the shank 26 and threads into a threaded aperture 34 in the robot end effector 14.

The end effector finger 14 can be made of a corrosion resistant material such as stainless steel. Advantageously, the end effector finger 14 are coated with a corrosion resistant film such as fluorocarbon.

In this way, the end effector fingers 14 may be readily removed from the rest of the robot arm to facilitate cleaning, treatment and maintenance. After use, the end effector finger 14 can be readily returned to its precise position on the robot end effector 12. It is important that the end effector finger be precisely positioned since the robot only knows programmed movements and cannot accommodate for changes in alignment of the end effector fingers 14.

While the present invention has been described with respect to a single preferred embodiment, those skilled in the art will appreciate numerous modifications and variations. It is intended that the appended claims cover all such modifications and variations as fall within the true spirit and scope of the present invention.

What is claimed is:

1. A wet wafer processing robot comprising:

an arm having an end effector finger adapted to engage a wafer carrier, said finger being removable from said arm;

said finger having a length, said finger arranged to extend transversely to said arm over a substantial portion of the length of said finger; and an alignment device including a threaded fastener and at least one pin, said device extending transversely to the length of said finger through said finger and parallel to and into said arm.

2. The robot of claim 1 wherein said end effector has a free end, said free end having a hook-shaped grasping element.

3. The robot of claim 1 including a screw extending transversely to the length of said finger and a threaded opening to receive said screw so as to threadedly engage said arm, a pair of pins on either side of said screw, each of said pins arranged to engage slots on either side of said threaded opening in said arm.

4. The robot of claim 1 wherein said finger is coated with a corrosion resistant film.

5. The robot of claim 4 wherein said finger is coated with fluorocarbon.

6. A method of maintaining a robot used for wet wafer processing comprising:

removing a wafer carrier engaging finger from a robot arm;

cleaning said finger;

orienting said finger with the length of the finger being transverse to the length of said arm;

aligning said finger precisely with said robot arm; and securing said finger to said robot arm by extending fasteners through said finger transversely to the length of said finger into said arm in a direction parallel to the length of said arm.

7. The method of claim 6 including using a pair of pins to guide said finger into alignment with the rest of said arm.

8. The method of claim 7 including using a threaded fastener to secure said finger to said arm.

* * * * *